(12) United States Patent
Niebert et al.

(10) Patent No.: US 9,521,713 B2
(45) Date of Patent: Dec. 13, 2016

(54) PROGRAMMABLE MODULE FOR A MODULAR INSTALLATION OF SIGNAL TRANSMITTERS AND METHOD OF DRIVING THE INSTALLATION

(71) Applicants: UNIVERSITE DE LA MEDITERRANEE—AIX MARSEILLE II, Marseilles (FR); CENTRE NATIONAL DE LA RECHERCHE SCIENTIFIQUE, Paris (FR)

(72) Inventors: Peter Niebert, Marseilles (FR); Mathieu Caralp, Marseilles (FR)

(73) Assignees: UNIVERSITE D'AIX MARSEILLE, Marseilles (FR); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 0 days.

(21) Appl. No.: 15/023,651

(22) PCT Filed: Sep. 16, 2014

(86) PCT No.: PCT/FR2014/052303
§ 371 (c)(1),
(2) Date: Mar. 21, 2016

(87) PCT Pub. No.: WO2015/040324
PCT Pub. Date: Mar. 26, 2015

(65) Prior Publication Data
US 2016/0234892 A1   Aug. 11, 2016

(30) Foreign Application Priority Data
Sep. 20, 2013 (FR) .................................. 13 59064

(51) Int. Cl.
H05B 33/08 (2006.01)
F21S 2/00 (2016.01)
(Continued)

(52) U.S. Cl.
CPC ........... *H05B 33/0806* (2013.01); *F21S 2/005* (2013.01); *F21S 8/08* (2013.01); *F21Y 2101/02* (2013.01); *H05K 1/189* (2013.01)

(58) Field of Classification Search
CPC ............. H02J 1/00; H02J 50/80; H05K 1/189; H05K 3/363; H05K 1/118; H05K 1/144; H05K 1/0215; H05K 1/0278; H05K 1/117; H05K 1/181; H05K 2201/041; H05K 2201/058; H05K 2201/09027; H05K 3/341
(Continued)

(56) References Cited

U.S. PATENT DOCUMENTS

| | | | |
|---|---|---|---|
| 2007/0182676 A1 | 8/2007 | Sinyugin et al. | |
| 2013/0322082 A1* | 12/2013 | Hollander | F21S 2/005 362/249.02 |
| 2014/0240909 A1* | 8/2014 | Stewart | G06F 1/16 361/679.02 |

FOREIGN PATENT DOCUMENTS

| | | |
|---|---|---|
| WO | 2010116283 A2 | 10/2010 |
| WO | 2011106623 A1 | 9/2011 |

(Continued)

OTHER PUBLICATIONS

International Search Report issued Dec. 16, 2014 re: Application No. PCT/FR2014/052303; pp. 1-3.

*Primary Examiner* — Tuyet Vo
(74) *Attorney, Agent, or Firm* — Cantor Colburn LLP

(57) ABSTRACT

Programmable module (1) for a modular installation (IN), comprising:—a support base (2) delimited by edges (20);—at least one signal transmitter (3);—at least one measurement sensor generating local-measurement data;—at least one controller (4) driving the transmission of the signals and receiving the local-measurement data;—at least two connectors (5) fixed on the edges of said base and (Continued)

exhibiting an electrical power supply interface, and a bidirectional communication interface connected to the controller and exhibiting a communication input and a communication output; where at least one of said connectors may be connected with a connector of a neighbouring module in the modular installation so as to allow a bidirectional communication between the controller of said module and the controller of said neighbouring module and a distributing of the electrical power supply between the modules. The present invention finds an application in the field of luminous installations.

19 Claims, 7 Drawing Sheets

(51) Int. Cl.
    *F21Y 101/02*     (2006.01)
    *F21S 8/08*     (2006.01)
    *H05K 1/18*     (2006.01)

(58) Field of Classification Search
    USPC ....... 362/280, 257, 258, 278, 287, 362, 365, 362/367
    See application file for complete search history.

(56) References Cited

FOREIGN PATENT DOCUMENTS

| | | |
|---|---|---|
| WO | 2011123920 A1 | 10/2011 |
| WO | WO 2012087901 A2 | 6/2012 |

\* cited by examiner

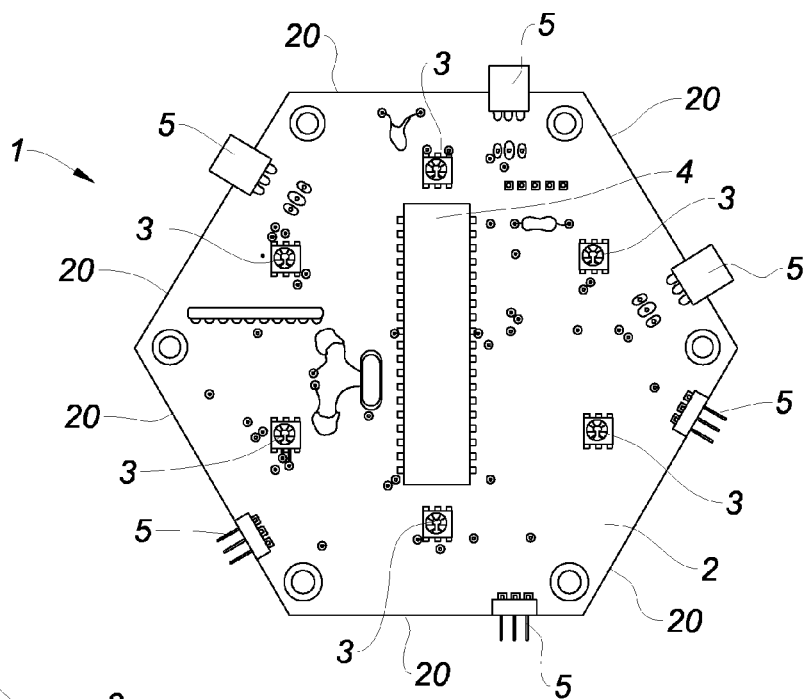
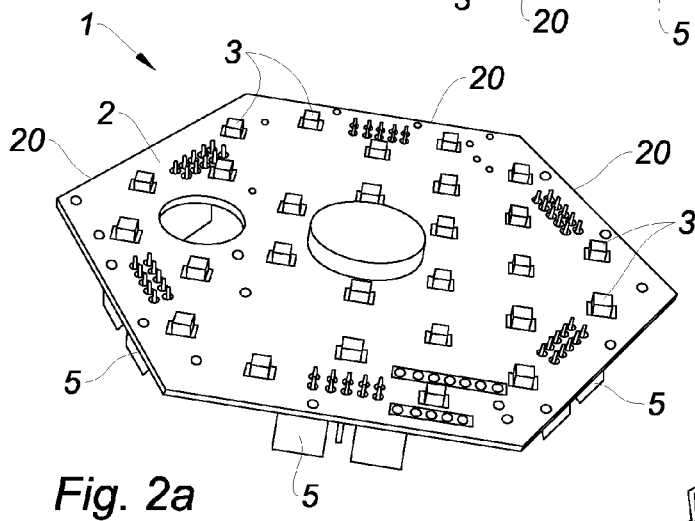
*Fig. 1*
*Fig. 2a*
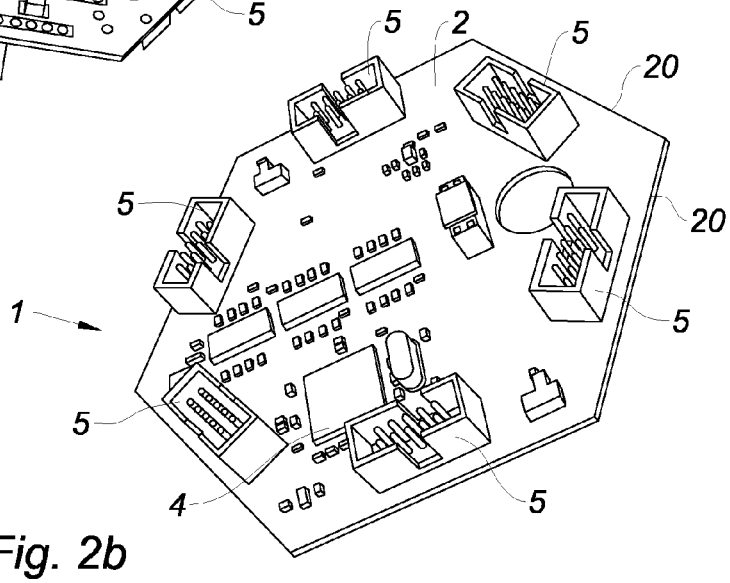
*Fig. 2b*

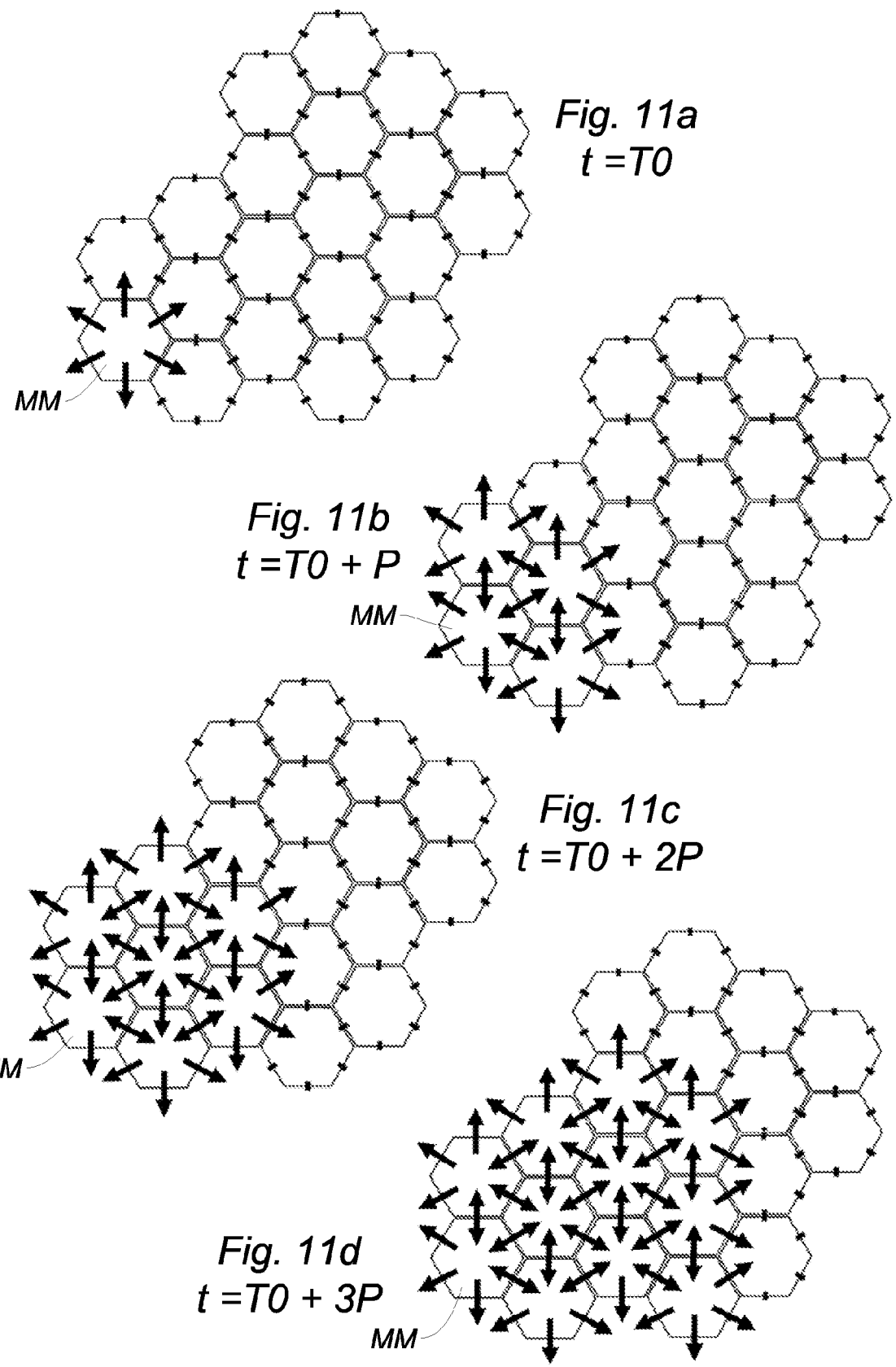

PROGRAMMABLE MODULE FOR A MODULAR INSTALLATION OF SIGNAL TRANSMITTERS AND METHOD OF DRIVING THE INSTALLATION

TECHNICAL FIELD

The present invention relates to a programmable module for a modular installation of signal transmitters, in particular of the type light signal transmitter.

It also relates to a modular installation of the type comprising a plurality of such modules, as well as a method for driving such modular installation.

The present invention is in particular applicable in the field of light modules, in other words modules integrating light signal transmitters, otherwise called light sources.

However, the present invention is liable to be applied in other fields, with modules integrating transmitters of other types of signals than light signals, such as sound signals.

BACKGROUND

It is known to integrate several light modules in a network within an installation. By way of example, the documents WO 2011/106623, WO 2010/116283 and WO 2011/123920, each discloses a network of light modules driven by one or more controller(s) and hierarchically organized, in particular according to an organization in cascades.

A problem lies in the conventional implementation of a hierarchy of the modules, in other words an organization of the modules according to a predefined hierarchy which requires the use of a network layer between a controller and each light module. Such hierarchy then sets limits in terms of size, because the network layer of the controller is necessarily limited to a maximum number of light modules with which it may communicate. Thus, the dimensions of the installation or the number of modules present in the installation will be limited by the limits of the network layer, prohibiting any extension of the installation beyond a critical threshold.

BRIEF SUMMARY

The present invention aims to solve this drawback by providing a programmable module which allows increasing the size of the modular installation by adding modules, in other words by the connection of new modules on the existing modules, with the advantage of having a «scalable» installation, that is to say adapted to a scale change while maintaining its first functionality (signal transmission, for example light signals) by gradual addition of modules.

The present invention also concerns an associated driving method which implements a propagation of distributed algorithms step by step, according to a cyclic, periodic and synchronous operation.

To this end, it provides a programmable module for a modular installation of signal transmitters, said module comprising:
a support base delimited by edges;
at least one signal transmitter fastened on said base;
at least one controller fastened on said base and linked to said at least one signal transmitter for driving the transmission of the signals;
at least two connectors fastened to the edges of said base and linked to said controller, each connector having:
an electrical power supply interface for said at least one signal transmitter and said at least one controller; and
a bidirectional communication interface connected to said at least one controller and having a communication a communication input and a communication output;
where at least one of said connectors may be connected with a connector of a neighboring module in the modular installation to allow a bidirectional communication between the controller of said module and the controller of said neighboring module and a distribution of the electrical power supply between the modules.

Thus, several modules in accordance with the invention may be physically connected to each other and communicate between neighboring modules due to their connectors, with the advantage that these connectors or bidirectional communication interfaces allow quasi-synchronous driving of the modules, to finally obtain an «intelligent» module which transmits signals according to its network environment (namely these neighboring modules or at least close ones).

According to a feature, at least one signal transmitter is a light signal transmitter, in particular of the light-emitting diode type.

In this manner, the invention is in particular advantageously applicable in the installations of light modules such as the interior or exterior lighting, the display, etc.

According to another feature, the module further comprises at least one sensor for measuring a local parameter fastened on the base, said at least one sensor generating local measurement data and the controller being linked to said at least one sensor for receiving said local measurement data.

Thus, it is possible to take into account the local external environment of each module due to the sensor(s), to obtain an «intelligent» module which transmits signals also according to its local external environment (due to the measures of the sensor(s)).

The measuring sensor may be of the proximity sensor type, but other sensor types may be, of course, considered, such as pressure sensor, temperature sensor, brightness sensor, etc.

The proximity sensor detects the approach of an object or a person, and the controller integrates this measurement data to optionally (depending on the driving algorithm) modify the driving of the signal transmitter(s). In other words, the controller reacts to this approach by varying the transmission of signals.

In a particular embodiment, the module includes a connector on each edge, so that each edge of the module may be connected with the edge of a neighboring similar module, to eventually be able to obtain a complete tiling of a surface by means of interconnected modules.

The invention also relates to a modular installation of the type comprising several modules in accordance with the invention, in which each module has at least one connector connected to a connector of a neighboring module.

This installation is completely «scalable», as defined beforehand, thus allowing having arbitrary sized installations, depending on the number of used modules; bearing in mind that the more modules in the installation there are, the more controllers there are to execute the driving algorithm of the installation in parallel. Such installation has the advantage that it requires no communication centralized bus, since the communication is local between neighboring modules in the installation due to their bidirectional communication interfaces and, thus, the larger the installation is, the more the communication local channels there are.

In the installation, the mounting and the structure of the modules guarantees a local communication between the modules which facilitates the wiring: it is indeed sufficient to supply the installation of modules in a network to a sufficient number of module connectors to distribute the current to the set of modules via their power supply interfaces. For the data communication, and in particular of the distributed algorithm(s), a single connector is sufficient to introduce the algorithm within the entire network.

This installation is in particular advantageous because the communication interfaces between neighboring modules ensures a fast local communication depending on the bandwidth of the interfaces of the controller. The global communication through protocols will be submitted to latency constraints which depend on the size of the installation, but the invention considers a communication protocol which carries out a «broadcast» of a very low bandwidth, but of an insignificant latency from a point of origin.

Thus, the controllers perform the communication tasks themselves and manage furthermore the driving of the signal transmitters and the reading of the measurement data coming from the sensors, without the use of additional active components.

Advantageously, the installation further comprises a single source of a driving program of the controllers of the modules, said external source being provided to be connected to a controller of a module called master module.

This source may comprise an external source for loading the program which is connected to a connector of the master module, or a storage unit or a memory in which the program is stored and which is plugged in on the master module.

The invention also relates to a synchronous driving method of a modular installation in accordance with the invention, in which each module executes the same program in a cyclic, periodic and synchronous manner, in which, at each cycle, each module establishes a bidirectional communication with the neighboring module(s) and executes one or more algorithm(s) of said program.

The particularity of this driving method thus lies in a quasi-synchronous operation between neighboring modules of the installation, with a synchronous programming. In other words, each module executes the same program in a pseudo-parallel programming mode, so that, finally each controller drives the signal transmitter(s) of its module by the implementation of the same program.

It is understood that if the modules are of different types (in particular in terms of geometry of the base and/or the number of connectors), the same program executed by all modules may be configured so that the execution of this program by a type I module leads to the execution of certain algorithms of the program, and the execution of this program by a type II module leads to the execution of certain other algorithms of the program. Thus, there may be some distinctions in the execution of the same program, according to the type of module.

The method then operates on the basis of a synchronous language which accesses the controllers so that each controller carry out simple tasks: driving and monitoring the signal transmitter(s), communicating with the controllers of the neighboring module(s), reading the sensor(s), listening on the communication interfaces, receiving and transmitting data on these communication interfaces.

The programming is also parallel on the same module which allows carrying out several independent real-time functions. It may also be considered that the communication between neighboring modules is a parallel communication performed on several virtual channels, so that several distributed driving algorithms may be executed in parallel.

Advantageously, a module called master module constitutes a single source of the periodic timing for the execution of the same program by the modules, where said master module generates a synchronization signal which is propagated step by step between the modules starting from the master module via their respective connectors.

This synchronization signal advantageously allows adjusting the synchronization between the modules, by propagating it through all the modules; each module receiving the synchronization signal to be immediately transmitted to the neighboring modules.

According to a possibility of the invention, the execution of the same program by the modules is preceded by a phase for input a driving algorithm to the controller of at least one module called master module, in the form of data frames distributed in successive periodic cycles, the other modules being called slave modules, and in which the execution of the same program by the modules includes the following phases:
  a first phase for executing a distribution algorithm in which data frames of the driving algorithm are synchronously and periodically distributed, step by step between the modules starting from at least one module called master module;
  once the distributed driving algorithm is completely loaded in all controllers, a second phase for synchronously and periodically executing the driving algorithm by each controller.

Thus, each module executes in the second phase the same driving algorithm in a pseudo-parallel programming mode, the controllers synchronously executing this previously distributed algorithm during the first phase, which involve for example the implementation of a distributed bootloader for the first phase, in other words, the distribution of the driving algorithm from a single source.

In a particular embodiment, the first distribution phase is preceded by a phase for determining a maximum distance corresponding to the greatest distance between the at least one master module and the most distant slave module(s) in the installation by rooting from a neighboring module to a neighboring module according to the shortest path(s), to establish the time required for the distribution phase so that the distributed driving algorithm is completely loaded in all controllers.

In this manner, the method is certain that all modules have indeed loaded the driving algorithm before starting the execution phase. In other words, all modules wait for the last data of the driving algorithm to be distributed in the «last» module (the distribution being performed at the same rate and step by step) which guarantees that the start of the driving algorithm is synchronously performed.

According to one feature, the phase for determining the maximum distance is carried out either by establishing the topology of the installation or by circulating, step by step between the modules, a function for estimating the maximum distance which progresses as and when it propagates in the installation until reaching a maximum corresponding to the maximum distance.

According to a possibility of the invention, the phase for inputting the driving algorithm and the first phase for executing the distribution algorithm are performed:
  either sequentially, where said first phase begins once the driving algorithm is completely loaded in the controller of the at least one master module;
  or in parallel, where each controller of a module receives in a current cycle a data frame of the driving algorithm and propagates it to the controller(s) of the neighboring module(s) in the next cycle.

According to another possibility of the invention, during the first phase for executing the distribution algorithm, at each cycle, the controller of each module carries out the following operations:
- receiving a synchronization signal on at least one communication input, and transmitting the synchronization signal on the communication outputs;
- listening on all communication inputs of the module;
- receiving a data frame of the driving algorithm on at least one communication input of the module, said data frame corresponding to a data frame transmitted during the previous cycle by a neighboring module on the communication output connected to said communication input of the module;
- storing said data frame in said controller;
- transmitting said data frame on the communication outputs to the neighboring modules.

In accordance with one feature of the invention, during the second phase for executing the driving algorithm, at each cycle, the controller of each module carries out the following operations:
- receiving a synchronization signal on at least one communication input, and transmitting the synchronization signal on the communication outputs;
- listening on all communication inputs of the module;
- reading the measurement data coming from the at least one sensor;
- reading variables called state variables representative of the state of the module, in particular the state of the at least one signal transmitter;
- reading a data packet called incoming data packet on at least one communication input of the module, said data packet integrating at least one input variable for the execution of the driving algorithm;
- executing the driving algorithm with, as an input, the input variable(s) or the data packet(s) received in the current cycle, the measurement data and the state variables, and, as an output, driving instructions of the signal transmitter(s) of the module, updating the state variables, and calculating output variables associated with each communication output;
- transmitting on each communication output of a data packet called outgoing data packet integrating the output variables associated with each communication output.

In practice, the state of each module is represented by its own variables, otherwise called local variables, and there are three types of local variables in the present installation:
- the input variables which are read on the communication inputs, which do not depend on the module and whose values come from outside;
- the output variables, that the controller generates after executing the driving algorithm and modifies to communicate with neighboring modules; and
- the other variables which represent its state, namely the state variables which reflect for example the state of the signal transmitter(s), and the measurement data coming from the sensor(s).

As such, each module controller is conformed to store these variables, and to carry out complex behaviors or functions. For example, a controller may use one or more counter(s) to count the time before changing an output (thus introducing a time out), may use several consecutive measurement data coming from a sensor to make filters, etc.

It may be also considered that, during the second phase for executing the driving algorithm, at each cycle, the incoming data package or each incoming data package in a current cycle corresponds to an outgoing data packet transmitted during the previous cycle by a neighboring module on the communication output connected to said communication input of the module, and the outgoing data packet or each outgoing data packet transmitted in a current cycle is received by the concerned neighboring module in the next cycle.

This case corresponds to a direct communication step by step between a module of rank n and a module of rank n+1.

It may also be considered that a module of rank n may also communicate with a neighboring module of rank n+2 thus avoiding introducing two delay cycles between these two modules. It is of course possible to extend this communication between distant neighbors to rank gaps greater than 2. Such communication approach between distant neighbors allows a module to look beyond its direct neighbors, which may prove to be very advantageous to optimize local behaviors.

According to a first possibility, the second phase for executing the driving algorithm comprises, preferably at the beginning of the second phase, a communication phase with a single timing source without jitter control, the single timing source being given by the synchronization signal at the beginning of each cycle sent by the controller of at least one master module.

Advantageously, this communication phase with a single timing source without jitter control is carried out as follows: during each period, the controller of each non-master slave module located at a rank n relative to the master module, distributes a data packet subdivided into several time slots allocated in the following manner:
- a first time slot allocated to the synchronization signal;
- a second time slot called data empty waiting time slot, said second time slot having a duration T2 where:

$T2 \geq \epsilon + \gamma$, with $\epsilon$ the minimum propagation time between the controller of a module and the controller of the next neighboring module; and $\gamma$ the jitter of the cycle;
- a third time slot allocated to the output variables; and
- a fourth time slot called dead time slot, said fourth time slot having a duration T4, where $T4 \geq \epsilon + n\gamma$ with n the rank of the module relative to the master module in the communication chain.

This is referred to as a locally synchronous operation without jitter control, with a single timing source. This operation is to promote for starting the installation, as well as for detecting defective modules.

According to one second possibility, the second phase for executing the driving algorithm comprises, preferably after starting the installation, a communication phase with a variable number of timing sources and with jitter control, in which a controller of at least one slave module generates its own synchronization signal that it transmits to the neighboring modules on its communication outputs.

Advantageously, this communication phase with a variable number of timing sources and with jitter control is performed as follows: the controller of each slave module carries out the following steps:
- if elapsed, since receiving the synchronization signal from the data packet of the previous cycle coming from a neighboring module called previous neighboring module, a time slot called delay time slot Tdelay, then said controller transmits a data packet with a synchronization signal to the other neighboring modules called next neighboring modules without waiting for the synchronization signal of the data packet of the next cycle which will come from said previous neighboring module, where:

$T_{delay} = P + \epsilon + \gamma$, with

P the duration of the cycle of the master module;

$\epsilon$ the minimum propagation time between the controller of a module and the controller of the next neighboring module; and $\gamma$ the jitter of the cycle;

if, upon receipt the synchronization signal of a data packet of the current cycle coming from a previous neighboring module, there is, since receiving the synchronization signal of the previous cycle coming from said previous neighboring module, a time slot called advance time slot Tadvance, then the controller waits for a time slot Tshift before transmitting on its outputs the data packet to the next neighboring modules, where:

$Tadvance \leq P + \delta$, with $\delta$ the shift time between the cycle of the module and the cycle of the previous neighboring module, where $\delta \leq \epsilon + \gamma$.

This is referred to as a locally synchronous operation with jitter control, to promote for an optimized operation after starting.

Furthermore, it is advantageous that the second phase for executing the driving algorithm implements a data routing protocol, in which during each cycle the exchanged data packets between two neighboring modules are cut and sent in several groups distributed over time slots greater than a shift time of the propagation between two neighboring modules of rank n and n+1 respectively, so that each byte of a group of order NO is received on a connector before sending the corresponding byte of a group of higher order NO+1 on another connector.

BRIEF DESCRIPTION OF THE DRAWINGS

Other features and advantages of the present invention will appear on reading the detailed description hereinafter, the non-limiting examples of implementation, made with reference to the appended figures in which:

FIG. 1 is a schematic view of a first module according to the invention;

FIGS. 2a and 2b are schematic views of a second module according to the invention, viewed respectively from below and from above;

FIGS. 11a to 11d are schematic views of the propagation of a synchronization signal in an installation of the type of FIG. 8;

DETAILED DESCRIPTION

Figure 3:
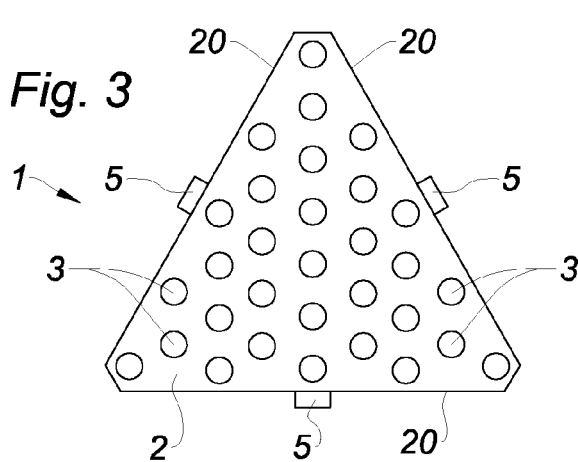
FIG. 3 is a schematic view of a third module according to the invention.

The first part of the description relates to the achievement of a module 1 according to the invention. The module 1 is a programmable module, in other words designed to be driven by a computer program or a driving algorithm, which is intended to form a unitary and demountable element of a modular installation IN.

FIGS. 1 to 4 illustrate four embodiments of a module 1; the same numeric reference will be used to describe the elements or members being similar, identical or having the same functionalities.

Generally, a module 1 includes a support base 2, preferably made of a rigid material, having a polygonal shape delimited by edges 20. In the example of FIGS. 1 and 2 the base 2 has an hexagonal shape delimited by six edges, in the example of FIG. 3 the base 2 has an equilateral triangular shape delimited by three edges and in the example of FIG. 4 the base 2 has a rectangular shape delimited by four edges. It may be, of course, considered to provide a base with a square, diamond, right-triangular shape, etc. This base 2 serves as a physical support for the different members described hereinafter.

Module 1 also includes at least one signal transmitter 3 fastened to the base 2, and in particular several signal transmitters 3. In the following description, the signal transmitter 3 is of the type light signal transmitter, in particular of the light-emitting diode type. Thus, this is referred to as a light module 1 and a light installation IN. In the example of FIG. 1 the module 1 includes six light-emitting diodes 3, in the example of FIG. 2 the module 1 includes twenty-seven light-emitting diodes 3, in the example of FIG. 3 the module 1 includes thirty-one light-emitting diodes 3, and in the example of FIG. 4 the module 1 includes seven light-emitting diodes 3. It may be, of course, considered that the signal transmitter is of another type, such as a sound signal transmitter, as it may be considered to bring together on the same module 1 at least two distinct types of signal transmitters.

The module 1 further includes at least one measuring sensor (not illustrated) of a local parameter fastened to the base 2, the sensor or each sensor generating local measurement data. By way of example, the sensor can be of the proximity sensor type—otherwise known as presence detector—which can be of the capacitive or inductive type, or pressure sensor type, or temperature sensor type, or light sensor type, etc. The role of the sensor is to measure a parameter (proximity or presence of a person or an object, temperature, pressure, light, etc.) in the local environment of the module 1.

The module 1 also integrates at least one controller 4 fastened to the base 2, in particular of the microcontroller type. This controller 4 is linked to:
- the signal transmitter or each signal transmitter 3 to drive the transmission of the signals by the concerned transmitter; and
- the sensor or each sensor to receive these local measurement data.

The module 1 also integrates at least two connectors 5 fastened to the edges 20 of the base and linked to the controller 4. Each connector 5 has:
- an electrical power supply interface for the electrical power supply of the signal transmitter(s) 3 and of the controller 4; and
- a bidirectional communication interface connected to the controller 4 and having a communication input and a communication output.

Each connector 5 of a module 1 is formed to be physically connected with a connector 5 of a neighboring module 1 (if such neighboring module is of course present) in the modular installation IN to allow:
- a bidirectional communication between the controller of the module 1 and the controller of the neighboring module 1 (in other words, the data transmission in both directions between the two controllers), where the communication input of a connector is connected to the communication output of the other connector 5, and vice versa; and
- a distribution of the power supply between the modules 1.

For the rest, neighboring modules mean two modules 1 which have adjacent, even contiguous edges 20; the connection between the two modules 1 occurring with the connectors 5 placed on these contiguous edges 20.

To connect two connectors 5 of neighboring modules 1, two configurations may be considered: symmetrical configuration and asymmetric configuration.

In the asymmetric configuration, the two connectors are asymmetric, with a connector 5 having a male connector and the other connector 5 having a female connector for a male-female connection between the two connectors 5. It is then necessary, in order to carry out the installation IN, to always provide a male connector in front of a female connector. As such, it is advantageous to provide for each module 1 as many male connector as female connector, and to properly orient each module 1 in the installation to match male connector and female connector. In the example of FIG. 1, the module 1 has three male connectors 5 and three female connectors 5.

In the symmetric configuration, the two connectors 5 are symmetrical. Thus, each connector 5 can be linked to any connector of the neighboring module 1, while ensuring the electrical connection and the communication. To ensure the electrical connection it is necessary that a connector plug 25 is linked to a plug of the other connector with the same voltage (for example, the ground and the supply voltage). For the communication connection, it is necessary that the communication output of a connector is linked to the communication input of the other connector and vice versa.

Two embodiments may thus be considered for this symmetrical configuration:
- a direct physical connection between the two connectors, using connectors which are male-female on both sides; or
- an indirect physical connection between the two connectors, by using an intermediate cable which links the two connectors to each other.

In the case of an indirect physical connection, the cable must be symmetrical and the connectors are both male (or both female) while the cable has two female (or male) opposite interfaces. In the example of FIGS. 2a and 2b, all connectors 5 are female type, and are provided to be also connected to female connectors 5 of neighboring modules 1 by means of cables.

By way of example, each connector forms a bidirectional communication interface supporting the UART mode, well adapted to the use of the module 1, although other modes may optionally be considered.

In order to carry out an installation 1 without hole, in other words where each module 1 is connected to all its neighboring modules 1 and where the bases 2 of the modules 1 are contiguously disposed, with the contiguous edges between two neighboring modules 1, it is preferable that the module 1 includes a connector 5 on each edge 20, which is the case of the modules 1 of FIGS. 1, 2 and 3.

Figure 4:
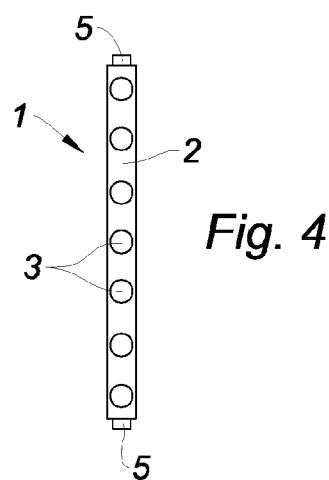
FIG. 4 is a schematic view of a fourth module according to the invention.

However, the module 1 of FIG. 4 has only two connectors 5 (against four edges), which are positioned on the shortest opposite edges of the base 2.

Figure 5:
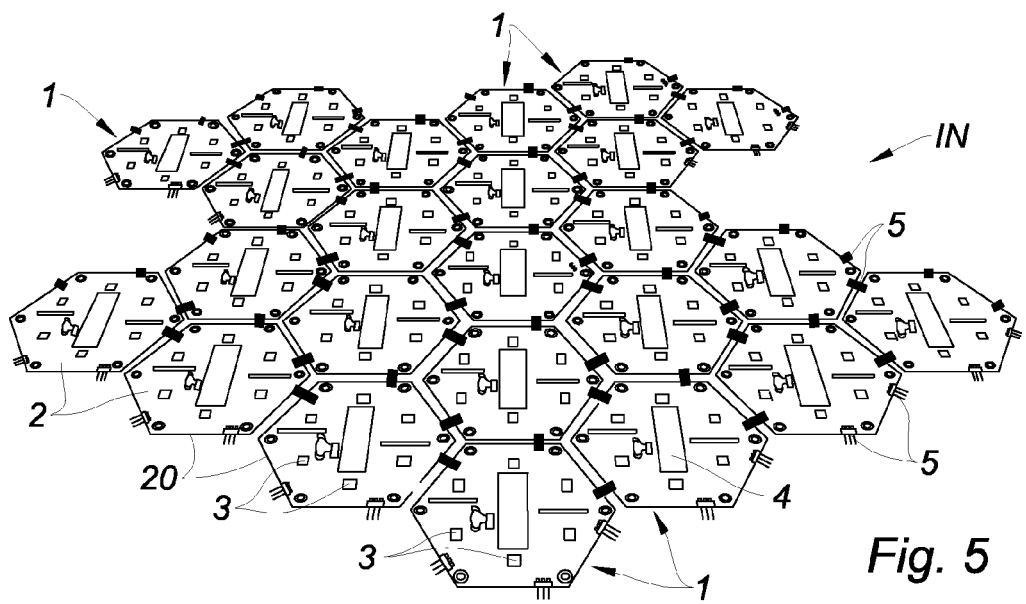
FIG. 5 is a schematic view of an installation of according to the invention integrating several interconnected modules of FIG. 1.
Figure 6:
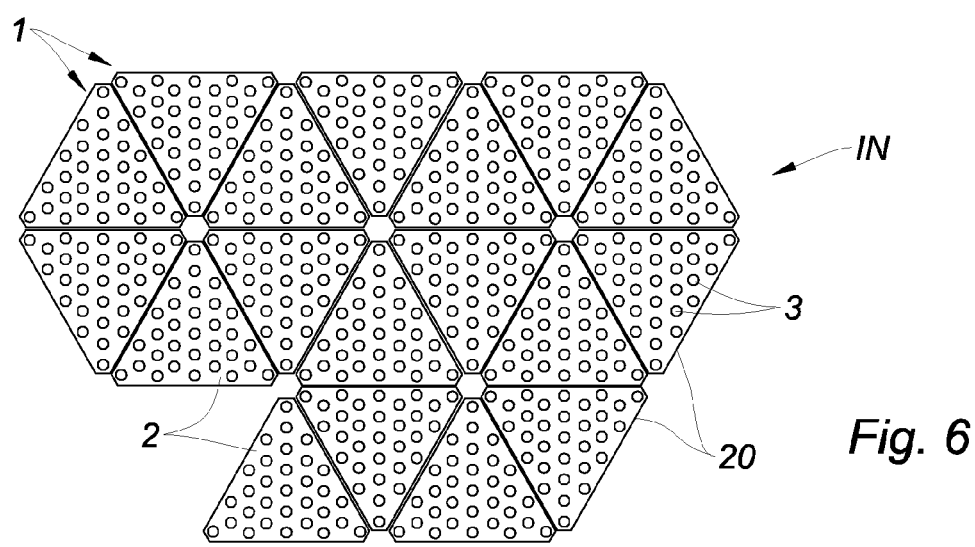
FIG. 6 is a schematic view of an installation according to the invention integrating several interconnected modules of FIG. 3.

FIGS. 5 and 6 illustrate installations IN composed of several interconnected and identical modules 1, with respectively hexagonal modules according to FIG. 1 and triangular modules according to FIG. 3. In these installations IN, the modules 1 are distributed according to a planar tiling with their bases contiguously disposed, without vacuum and without encroachment, and each module 1 is connected to its neighboring module(s) or by their respective connectors 5. It may be however considered to provide one or more holes in the installation IN, without one or more module(s) 1 in the tiling.

Figure 7:
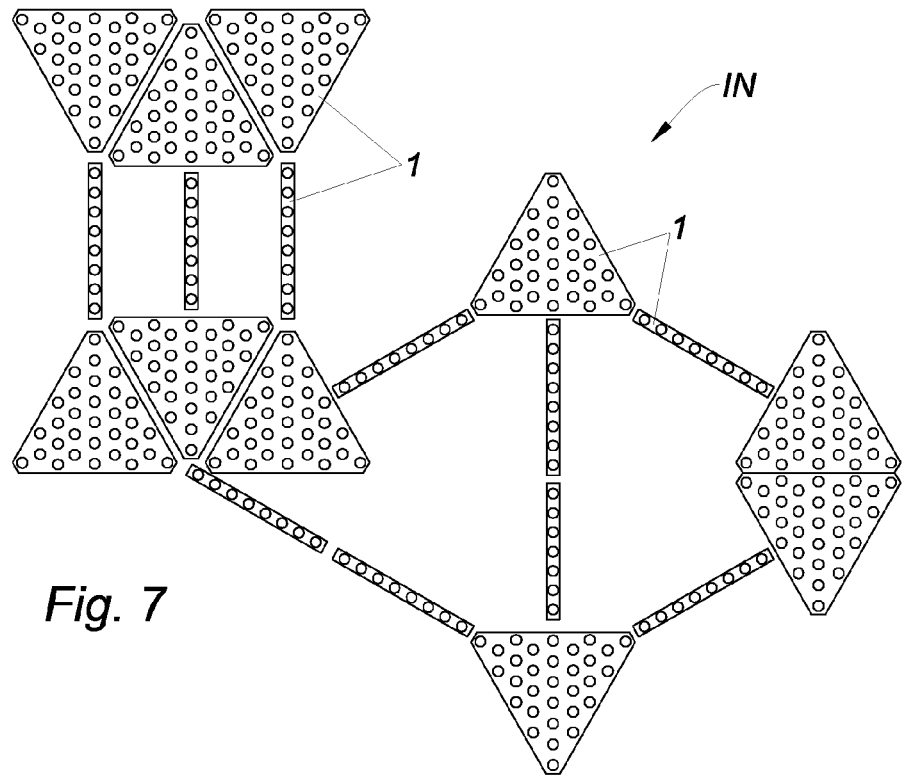
FIG. 7 is a schematic view of an installation according to the invention integrating several interconnected modules of FIGS. 3 and 4.

FIG. 7 illustrates an installation IN composed of several interconnected modules 1, with both triangular modules according to FIG. 3 and rectangular modules according to FIG. 4. In this installation IN, the bases of certain modules 1 are sometimes spaced from the bases of neighboring modules with which they are connected. Furthermore, the triangular modules also have connectors (not illustrated) at their respective summits, to be able to connect rectangular modules on the summits of the triangular modules.

Generally, it is of course possible to provide a connector on all or part of the summits of the bases of the modules, in order to increase opportunities for geometric configuration of the installation; the base 2 thus being delimited by edges and summits (or corners).

It may be also considered to carry out a volume installation, and not only planar, by distributing the modules according to a volume tiling.

The following description is about the method for driving a modular installation IN as described hereinabove.

In the installation IN, the modules 1 can communicate with neighboring modules in both directions and the driving method exploits this feature to implement a quasi-synchronous driving between neighboring modules where each module 1 executes the same program in a pseudo-parallel programming mode. Thus, each module executes the same program in a cyclic, periodical and synchronous manner as follows: at each cycle, each module establishes a bidirectional communication with the neighboring module(s) and executes one or more algorithm(s) of the program.

The method begins with a preliminary phase for inputting a driving algorithm to the controller 4 of at least one module 1 called master module, in the form of data frames distributed in successive periodic cycles, the other modules 1 being called slave modules. Then, the method executes the same program in a cyclic, periodic and synchronous manner, which is composed as follows:
- a first phase for executing a distribution algorithm in which data frames of the driving algorithm are synchronously and periodically distributed, step by step between the modules 1 starting from an at least one module 1 called master module;
- once the distributed driving algorithm is completely loaded in all controllers 4, a second phase for executing the driving algorithm by each controller 4 synchronously and periodically.

The first phase and the second phase both constitute execution phases of the same program by the set of controllers, where:
- in the first phase, each controller executes a first algorithm, said distribution algorithm, which has been previously loaded into a non-volatile memory (ROM or flash memory) of each controller, so that at the start of the installation (in other words, when applying electric voltage), each controller is ready to launch this first phase;
- in the second phase, each controller executes the driving algorithm previously distributed during the first phase, where each controller starts at the same time this second phase which will essentially comprising driving signal transmitters, and where the driving algorithm will have been stored in a volatile memory of each controller, in order to be able to distribute a new driving algorithm if it is desired to change the driving of the signal transmitters.

Concerning the input phase, it may be considered to connect the master module to an external source, such as a computer terminal, which will send data frames to the controller of the master module. It may be also considered to use, on one hand, a digital data storage removable unit (such as a memory card) for storing the driving algorithm and, on the other hand, a fixed reader on the master module and designed to read the data stored in said storage unit in order to execute the program by the controller of the master module.

It is noteworthy that the phase for inputting the driving algorithm and the first phase for executing the distribution algorithm (or distribution phase) are carried out:
- either sequentially, where the first phase begins once the driving algorithm is completely loaded in the controller of the at least one master module;
- or in parallel, where each controller of a module receives in a current cycle a data frame of the driving algorithm and propagates it to the controller(s) of the neighboring module(s) in the next cycle.

The particularity of the method lies in particular in the two following phases:
- the first phase, which refers to the distribution from module to neighboring module of a distributed driving algorithm, by the execution of a distribution algorithm, in particular of the boot loader type or «bootloader», which will propagate the driving algorithm from one or more source(s);
- the second phase which refers to a quasi-synchronous operation between neighboring modules, by the execution of the synchronous distributed driving algorithm(s).

A first advantage of the installation IN is its totally «scalable» character, that is to say that it offers the possibility to add as many modules as desired and thus to carry out an arbitrary size installation. Concerning the driving method, the more modules there are and the more controllers there are for executing the driving algorithm(s) in parallel; only the time of the distribution of the algorithm will however increase with the number of modules. In second advantage, installation IN does not require communication centralized bus, since the communication is local between neighboring modules and, once again, the more the installation IN integrates modules 1 and the more communication local channels will be. A third advantage is to allow the programming with a virtual machine model (byte code) which is interpreted by each module controller, and which is therefore independent of the architecture of the installation.

The following description relates to several aspects relating to this driving method which is assimilated to the cellular programming which combines the synchronous programming during the execution phase (in particular via synchronous co-routines) with the synchronous distributed programming during the first distribution phase, while optionally giving a geometrical direction to the connections between the modules 1 in the installation IN.

In such installation IN, each module 1 is linked to its neighboring module(s) 1 through communication interfaces, and the cellular programming is based on the following hypotheses:
- the installation IN functions as a network which operates quasi-synchronously, that implies a logic cycle or time;
- each module 1 executes the same program at the same synchronous timing;
- each module 1 consider directly only its own variables;
- the communication between modules 1 is made by propagation of values of certain variables, where the values are propagated with a delay cycle.

For the programming, each variable is understandable as an array indexed by the module 1, but whose access is local and only restricted to the concerned module 1: a module Mi can access to its own array of variable x[i], but it cannot directly access to the arrays of variables x[j] of the other modules Mj($j \neq i$).

A first aspect concerns the implementation of the first distribution phase.

The interest of the cellular programming described above is combining the distribution of driving algorithms and the synchronous programming. In the driving method, two data are essential to govern such a cellular programming:
- the operation is cyclic, periodic and synchronous;
- the communication is made by propagation of values of variables.

To facilitate the synchronization between modules, a module called master module constitutes a unique source of periodic timing by generating a synchronization signal (sometimes called «sync») which is propagated step by step between the modules starting from the master module via their respective connectors.

For the following description, the third following data is also retained: the channels are numbered in coherence with the orientation of the module 1 in the installation, and this is referred to as geometric algorithms which will be subject to a further description.

The first phase for distributing the distributed driving algorithms further depends on the following additional aspects:
- the algorithms are provided for static networks;
- the presence of a master module;
- the dimensions of the installation.

For the first distribution phase, the method may provide for implementation, of a wave distribution in which, starting from one or more initiator(s) (master modules), the propagation of data frames passes through the installation like a wave at the speed of the medium, namely one module per cycle, where:
the master module(s) trigger(s) the wave by sending data frames;
the slave modules wait and listen to receive these data frames and propagate them, with a delay cycle, to neighboring modules.

In other words, during the first distribution phase, at each cycle, the controller 4 of each module 1 performs the following operations:
receiving a synchronization signal on at least a communication input, and transmitting the synchronization signal on the communication outputs;
listening on all communication inputs of the module 1;
receiving a data frame of the driving algorithm on at least one communication input of the module, the data frame corresponding to a data frame transmitted during the previous cycle by a neighboring module on the communication output connected to this communication input of the module;
storing the data frame in the controller;
transmitting the data frame on the communication outputs to neighboring modules.

This wave distribution advantageously allows solving two problems related to the distributed programming:
informing all modules (problem of «broadcast»); and
combining a distributed information (problem of «mergecas»).

In all cases, the first distribution phase requires taking into consideration the dimensions of the installation IN, to answer the question of the termination of the propagation; this termination corresponding to when the process may stop propagating a wave because it is certain that the wave has passed through the entire installation IN and has reached all modules 1.

It is therefore advantageous that the first distribution phase is preceded by a phase for determining a maximum distance Dmax corresponding to the greatest distance between the master module and the farthest slave module(s) in the installation IN by routing from neighboring module to neighboring module according to the shortest path(s), to establish the time required for the distribution phase so that the distributed driving algorithm is completely charged in all controllers 4.

For greater clarity, it is important to define the following geometrical concepts, by considering the installation IN as a network comprising nodes (the modules) and channels (the direct connections between neighboring modules, which are as a reminder made by means of the connectors 5):
a path is a series of modules M0, M1, . . . , Mk such that each module Mi is linked by a channel to the neighboring module Mi+1;
the length of a path M0, M1, . . . , Mk is k, the number of channels to pass through;
the distance between two modules is the length of the shortest path(s) linking two modules to each other;
the diameter of the installation corresponds to the greatest distance between two of these modules;
the maximum distance Dmax corresponds to the greatest distance between the master module and a slave module.

For a connected network, each distance is finite and for a connected finite network, its diameter is finite.

If an upper terminal b for the diameter is known and if an algorithm in wave is iterated b times, then it is certain that the wave would have passed through the entire installation, because the diameter is greater than or equal to the maximum distance Dmax.

The phase for determining the maximum distance Dmax can be carried out in two ways:
first way: by establishing the topology of the installation;
second way: by circulating, step by step between the modules, a function for estimating the maximum distance Dmax which progresses with its propagation in the installation until reaching a maximum corresponding to the maximum distance.

Concerning the second way, it may be considered by proceeding, from the master module to the wave propagation of an estimation function where:
initially, the maximum distance is assumed to be zero;
then, at each cycle of the wave, each module communicates the known greatest distance to its neighbors incremented by 1, then combines it with the operator max with the distance values known by the neighbors.

The two following information for each module allow a global synchronization of the installation:
the proper distance Di of the module Mi vis-à-vis of the master module; and
the maximum distance Dmax between the master module and the farthest slave module(s).

Indeed, when the master module triggers a wave, a module Mn receives it n cycles later. On the other hand, all modules share information that the last modules will receive on time m from the trigger. Seen from a module Mn at a distance n, the latest modules will receive the wave (m−n) cycles later. It is then sufficient that each module Mn of a distance n wait (m−n) cycles after receiving the wave so that all modules may enter the same cycle in a desired state; thereby allowing globally synchronizing all the modules. In other words, each module may have its own counter (depending on its own distance to the master module) which decrements at each new cycle during the first phase, until reaching zero (all counters reach zero at the same time) so that all modules start the second phase at the same time.

For the first distribution phase, it may also be considered to proceed on an approach called the spanning tree approach to optimize the propagation.

While the first waves aim to spam the installation of information (the distributed algorithm(s)), it is possible to optimize the use of the bandwidth for subsequent waves. As such, during a distance propagation wave from the master module, each module Mn will receive one or several neighbors Mn−1 of a distance (n−1) its distance n. This module Mn may then select one of these neighbors as «parent», while the parent may be notified that it has a «child». The relation «parent-child» thus defined allows constituting a spanning tree with the master module at the root and the most distant modules at the ends.

Once a spanning tree is established, the method may then restrict the propagation of the waves between the master module and the set of modules with links to the spanning tree, thus releasing the communication channels between neighboring modules for other possible uses.

The rest of the description relates to an embodiment of the first distribution phase, by using a bootstrap program (otherwise called bootstrap loader or «bootloader») loaded beforehand in non-volatile memory (ROM or flash type) of the controllers.

A bootstrap program is a relatively small sized program which allows the installation and the execution of an application. The difficulty in the installation modular 1, which, as a reminder, comprises an interconnected controller network, is to update the firmware in each controller. As explained hereinabove, this update is carried out according to an approach of distributed algorithms, by using herein a distributed and very effective bootstrap program, since it is small-sized and fast in execution.

For the rest, it will be considered that each controller has a memory architecture model adapted for:
- executing the non-volatile memory and the random access memory;
- programming the non-volatile memory by software;
- protecting a part of the non-volatile memory against this programming.

In order to provide a bootstrap program (sometimes called «stage0») with minimum and unchanging size, which allows the distributed programming throughout the entire controller network, the bootstrap program «stage0» must have some features, namely:
- the bootstrap program «stage0» with minimum size and unchanging size has the task to deploy and execute a program in the random access memory of each controller of the network;
- the bootstrap program «stage0» may deploy as a program another bootstrap program called «stage1» with average size (ie greater than the size of the bootstrap program «stage0» which may be more effective, more complex and may deploy an application in the changing flash memory of each controller;
- the bootstrap program «stage0» must also allow launching an already deployed application in the flash memory of each controller, in particular by deploying a software of minimum size which performs a jump to the application address.

The operation of the bootstrap program «stage0» is unchanging in principle, in the sense that a change in the bootstrap program «stage0» is only possible by individually reprogramming each controller, while a change of the bootstrap program «stage1» requires no physical or manual intervention.

For the deployment (or the distribution) of a driving algorithm in the random access memory of each controller, and for its quasi-synchronous launching (or execution) by each controller, the following steps (a) to (l) are implemented:

Step (a): The bootstrap program «stage0» is initiated by cutting and recovery of the power supply, by setting the controllers so that a cut-off and a re-establishing the power supply necessarily lead to the execution of the bootstrap program «stage0» and all controllers asynchronously enters in a standby state.

Step (b): Each module controller identifies the presence of connected neighboring modules, in other words detects the connection of each of its connectors with a connector of a neighboring module.

By way of example, it is possible to proceed as follows: on each of its connectors, each controller puts the communication outputs in a state «1» and the communication inputs into the input mode with pull-up, that is to say that the communication input reads and recovers the state of the communication output of the neighboring module connected thereto. Thus, there are two possibilities:
- if the communication input is connected to a communications output (in other words if the concerned connector is connected to the connector of an neighboring module), then this communication input reads and recovers the state «1» which is the state of the communication output;
- if the communication input is not connected to a communication output (in other words the concerned connector is not connected to any other connector), then this communication input is put to the state «0», Step (c): After a predetermined time slot d1, any connector detected as being not connected with a neighboring module is blocked and marked as defective.

By continuing with the example hereinabove, any communication input read in a state «0» is blocked and marked as defective.

Step (d): After a determined time slot d2, each module controller goes into a mode of listening and propagating of the synchronization signal «Sync».

Step (e): After a determined time slot d3, the master module starts transmitting a periodic synchronization signal «Sync» of a period P.

Step (f): Each module controller which waits for the synchronization signal «Sync» receives and propagates it to its neighbors with a time shift comprised between $\epsilon$ and $(\epsilon+\gamma)$, where:
- $\epsilon$ is the minimum propagation time between the controller of a module and the controller of a next neighboring module; and
- $\gamma$ jitter of the cycle or propagation jitter.

Step (g): Then, each module controller goes into the reception mode on the communication inputs of its connectors, and waits for a determined time slot d4, where $d4 \geq (\epsilon+\gamma)$, before starting to transmit data.

Step (h): between each transmission of a byte, a wait interval d5 is inserted to ensure that the transmission by a module is slower than the reception by a neighboring module.

Step (i): Each byte may optionally be transmitted at least two times, for example three times. Upon receipt, the controller decides on the byte to be rebuilt by majority bit by bit. The probability of transmission error may be controlled by the velocity.

Step (j): An asymmetric protocol between the master module and the slave modules allows establishing:
- for any module, its distance from the master module and from a neighboring module closer to the master module;
- for any module, the most distant modules from the master module whose shortest paths pass therethrough, thus establishing the largest distance between the master module and the farthest module from the master module;
- the number of cycles to wait NAT so that the driving algorithm is loaded in all controllers, in other words the number of cycles before the jump to the synchronous execution of this driving algorithm.

Step (k): Then, the driving algorithm code is transmitted with length parameters, possibly of target address, and, in the last parameter, the number of cycles to wait NAT. In each controller, this number of cycles is the subject of a counter which is decremented during the propagation, then decremented at each cycle. Consequently, this counter reaches «0» at the same cycle for each module.

Step (l): When the counter reaches zero, the jump to the transmitted code is carried out and all controllers start at the same time executing the driving algorithm (in other words the second phase).

It may be considered to intercalate, between the first phase and the second phase, a phase for controlling the distribution algorithm loading in each module. This control phase may be in the form of a distributed control function on the set of modules, each controller executing this control function, then resending the control result to the master module. If a module has a loading default of the driving algorithm, then the first distribution phase is completely restarted.

A second aspect concerns the implementation of a synchronous programming in the second phase for executing the method.

The core of this synchronous programming is based on a synchronous programming language which ensures in particular the control of signal transmitters 3, the communication of the controllers 4 with the controllers 4 of the neighboring modules 1, the reading of the sensor(s) equipping the modules 1, the listening on the communication channel (or «broadcast»).

The synchronous programming is also parallel on the same module 1 which allows independently carrying out several functions in real time, by way of example the communication between neighboring modules 1 may be designed as a parallel communication over multiple virtual channels. Thus, several distributed algorithms may be executed in parallel by each controller 4.

An advantage of this solution is to provide a development environment integrated with a real-time simulator which allows developing and simulating programs on a computer without access to the actual installation.

The installation IN approaches a synchronous reactive system which interacts with an environment due to sensors equipping the modules 1 and due the readings of data coming from the neighbors modules 1. A synchronous program uses synchronous data streams or packets, guided by a certain timing generally called «cycle», «logical time» or «tick», which links each module 1 and its environment (neighboring modules and sensors).

A synchronous program passes then, for each module 1, four essential steps during a logical time:
e1) sampling/communicating the output signals;
e2) reading the input signals;
e3) calculating a response and updating the state of the module (in other words updating its internal variables);
e4) writing the output signals; Causality means that, for a cycle logic or logical time, the step e4) for writing the output signals is carried out after the step e2) for reading of the input signals. In return, the step e4) for writing the output signals of a current cycle will be carried out prior to step e2) for reading the input signals of the next cycle.

In practice, the cycle or the logic time follows a periodic mode, for example a cycle every 10 milliseconds or every milliseconds, etc.; the sampling period depending on the desired application.

Figure 13:
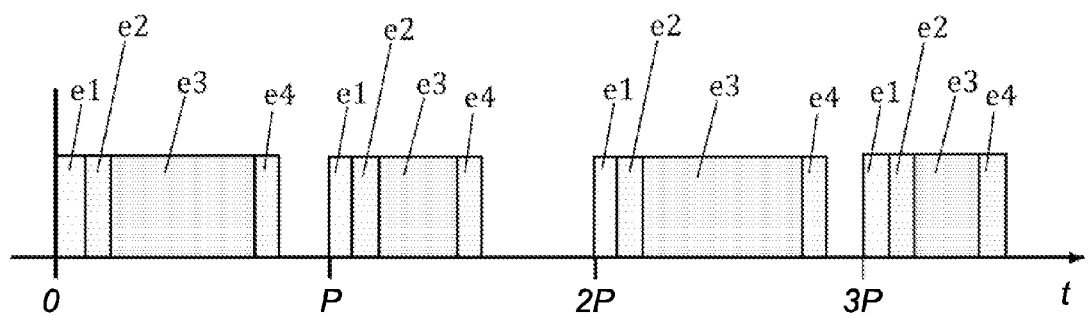
FIG. 13 is a schematic view of the calculation steps periodically implemented by the controller of a module during the phase for executing the program, according to a synchronous hypothesis.

FIG. 13 thus illustrates the operation of a controller of a module, according to a synchronous hypothesis, in which the controller successively performs the following calculation steps in each period P:
step e1) for sampling/communicating the output signals;
step e2) for reading the input signals (in particular comprising the measurement data and the data read on the communication inputs of the connectors);
step e3) for calculating a response and updating the module state;
step e4) for writing the output signals.

In other words, during the second execution phase, at each cycle, the controller 4 of each module 1 performs the following operations:
receiving a synchronization signal on at least one communication input, and transmitting the synchronization signal on the communication outputs;
listening on all communication inputs of the module (listening operation while waiting for receiving data coming from the neighboring modules);
reading measurement data coming from the sensor(s) equipping the module (a part of step e2) for reading of the input signals);
reading variables called state variables representative of the state of the module, in particular of the state of at least one signal transmitter (another part of step e2) for reading the input signals);
reading (or receiving) of a data packet called incoming data packet said at least one communication input of the module, said data packet integrating at least one input variable for the execution of the driving algorithm (another part of step e2) for reading the input signals);
executing the driving algorithm having, as an input, the input variables of the data packet(s) received in the current cycle, the measurement data and the state variables, and, as an output, driving instructions of the signal transmitters of the module, updating of the state variables (equivalent to step e3) for calculating a response and updating), and the calculation of the output variables associated with each communication output (equivalent to step e4) for writing the output signals);
transmitting on each communication output of a data packet called output data packet integrating the output variables associated with each communication output (equivalent to step e1) for sampling/communicating the output signals).

Thus, the driving algorithm executed by the controller of each module works with, as an input, the following input signals:
the measurement data coming from the sensor(s) integrated with the module;
the state variables representative of the state of the module whose state of the signal transmitter(s) integrated with the module;
the input variables (otherwise called incoming data packet) which corresponds to the incoming data on the communication inputs of the module.

In practice, the module may be represented by its own variables, namely, local variables comprising:
the input variables which do not depend on the module, but whose values come from the neighboring modules;
the measurement data;
the state variables; and
the output variables (otherwise called outgoing data packet) that the controller of the module changes to communicate with neighboring modules.

It is thus important that a module may store its local variables, and other possible information, to perform complex behaviors. For example, the module may use counters to count the time before changing an output (introduction of a delay), may use several consecutive measurement data which are stored to make filters, etc.

Since each module executes the same program, each module uses the same types of local variable, but these local variables are of course specific to each module. The set or part of these local variables may be thus in the form of a distributed matrix (the same as a distributed algorithm) where each module has access only to its own box of the matrix.

The advantage of the synchronous programming is its simplicity and ease of implementation, as well as its reliability. On the other hand, the reactivity of such programming is extreme and accurately known, with a latency equivalent to the sampling period.

As introduced beforehand, it may be appropriate to consider the orientations of the modules 1 in the installation, involving the use of distributed geometrical algorithms.

Figure 9:
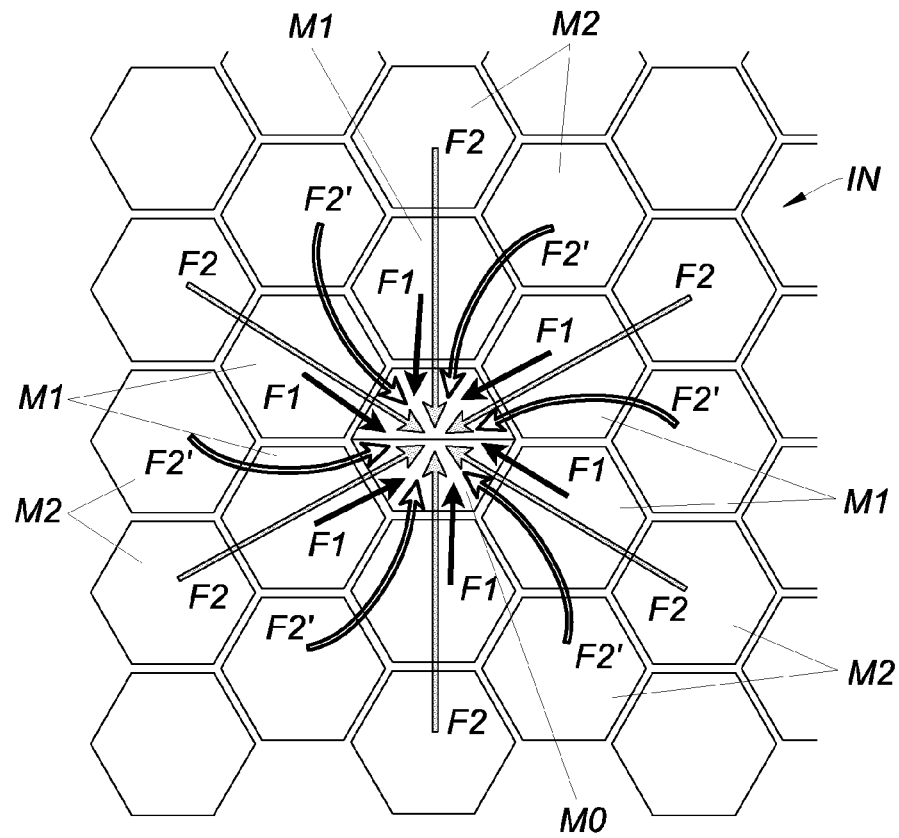
FIGS. 9 and 10 are partial schematic views of the installation of FIG. 8, with an illustration of the communications between a central module and its neighboring modules of rows 1 and 2.

For the following, it will be considered, with reference to FIG. 9, a module 1 provided with a hexagonal base and with six connectors disposed on the six respective edges of the base, in other words a module 1 of the same type as that of FIGS. 1, 2a and 2b. In FIG. 9, the controller, or the signal transmitter(s) and the sensor(s) are not illustrated for the sake of clarity.

These modules 1 called hexagonal modules are symmetrical and may be turned within the installation, so as it is not possible to rely on a homogeneous orientation of all modules 1. Thus, the connectors are the subject of a numbering C0, C1, C2, C2, C3, C4, C5 within the installation, which reflects the orientation of the modules.

The distributed algorithm(s) take into account the orientation of the modules 1 by providing a random rotation option for all modules 1 except the master module, the master module serves as a reference for the orientation of the slave modules.

In the case of a planar installation, it is possible to determine for each module, by a wave algorithm, its rotation related to the master module, and thus to assign a numbering of the connectors of each module. In some applications (such as the generation of drawings, texts or other geometrical shapes in an installation composed of light modules), a system of geometrical coordinates of the modules within the installation is required.

In the case of a planar installation, it is possible to determine, by a wave algorithm, the geometrical coordinates of the modules by taking a reference module, such as, for example, the master module. For this determination of the geometrical coordinates, it is necessary to calculate the displacement of modules relative to the directions of the channels.

In the case of a volume installation (in particular in the form of curved surface), it is difficult to establish a global coordinate system, but it is always possible to define a local coordinate system.

It is also possible to use the geometrical coordinates to delimit a sub-network of accessible modules from a geometrical position of an agent. Thus, a local program (or «broadcast») may be delimited at the same time by a geometrical and topological distance, and the agent can then control the vicinity of the module with various applications, such as, for example, applications of local drawings, etc.

Knowing the topology of the signal transmitters within the modules, the orientations of the modules and the geometrical coordinate system, it is then possible to assign to each module and to each signal transmitter of the geometrical coordinates. Thus, with light modules, it is possible to carry out a modular system with a «pixel» type management, where each module calculates for each signal transmitter a lighting value (switched on/off, brightness, color, etc.) depending on the coordinates.

The structure itself of the installation provides access to each module, with a delay cycle, to the values submitted by the neighboring modules on the corresponding communication outputs. In other words, during the execution phase, at each cycle, the incoming data packet or each incoming data packet in a current cycle corresponds to an outgoing data packet transmitted during the previous cycle by a neighboring module on the communication output connected to said communication input of the module, and the outgoing data packet or each outgoing data packet transmitted in a current cycle is received by the concerned neighboring module in the next cycle.

However, it may be desirable that each module 1 receives output data coming from non-neighboring modules (otherwise called neighboring modules of rank n, with n≥2) and then more distant than the neighboring modules (otherwise called neighboring modules of rank 1); being indicated that the transmission of data between non-neighboring modules necessarily requires several cycles. The interest of collecting such data allows each module to have a broader knowledge of its environment, beyond the neighboring modules, and these data will be integrated as additional input variables in the execution of the driving algorithm.

Figure 8:
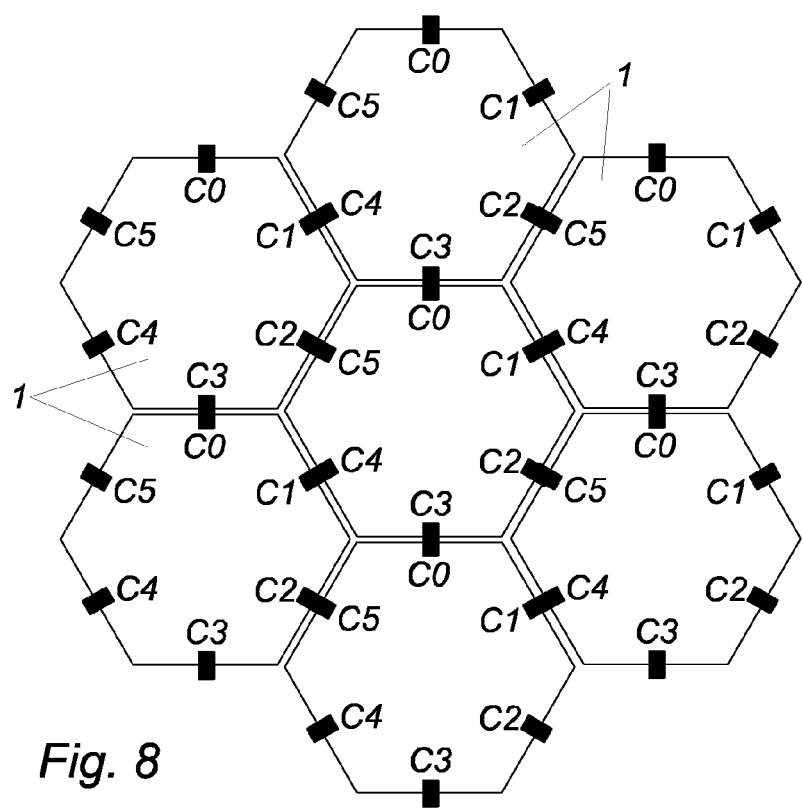
FIG. 8 is a partial schematic view of an installation according to the invention integrating several interconnected modules of FIG. 1, illustrating the numbering of the connectors of the modules.

FIG. 9 illustrates an installation IN of the same type as that of FIG. 8; the numbering of the connectors being not indicated in FIG. 9, reference will be usefully made to FIG. 8 for this numbering.

FIG. 9 illustrates the data communication between, on the one hand, a module called central module M0 and, on the other hand, neighboring modules (or neighboring modules of rank 1) M1 and non-neighboring modules M2 which are indeed neighboring modules of rank 2; by counting six modules M1 and twelve modules M2 (in the absence of holes in the tiling of the installation IN).

The six arrows F1 represent the communications of the input variables coming from the respective six modules M1 to the central module M0; these communications being direct with a delay cycle between the transmission and the reception.

The twelve arrows F2, F2' represent the communications of input variables coming from the respective twelve modules M2 to the central module M0; these communications being indirect because transiting by the modules M1, with at least two delay cycles between the transmission and the reception. In other words, the arrows F2, F2' correspond to information routings by passing through the crossed modules M1.

In order to achieve these communications F1, F2, F2' for collecting the values of input variables for the central module M0 coming from each of the modules M1, M2 at a given moment, it is possible to use three boxes dedicated in an output array out [i] [j] and an input array in [i] [j] for each module, where the index i represents a direction of the neighboring module of the communication and j represents a block of the frame. I will be possible to use out [i] [0] and in [i] [0] for the direct links F1 as well as in [i] [1] and out [i] [1] for the indirect links and F2 and in [i] [2] and out [i] [2] for the indirect links F2'.

The routing of data in the communications F2, F2' occurs in the intermediate modules M1 through assignments of the type out [3] [1]=in [0] [0] for the communication F2 which comes from the top, and out [3] [2]=in [1] [0] for the communication F2' which comes from the top on the right.

In order to synchronize information from different sources, the central module M0 may provide a buffer: the values received by the communications F1 would be then kept by the central module M0 in a buffer during a cycle, while pending the values received by the communications F2, F2'.

Figure 10:
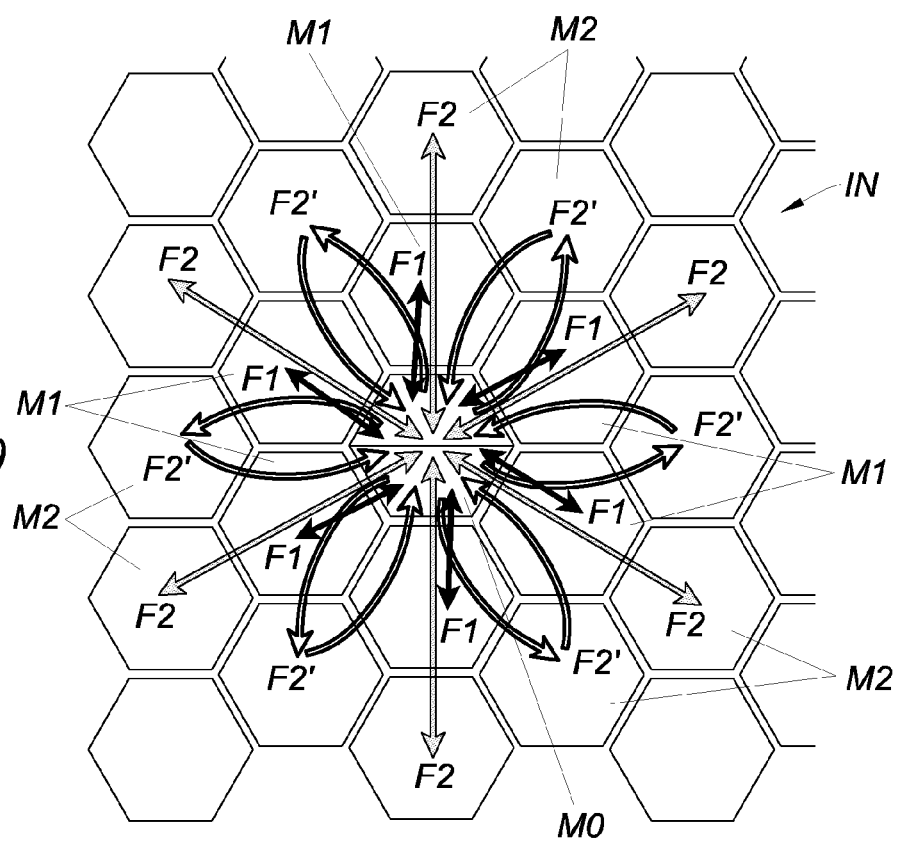

If each module applies the same routing principle, then it is possible that the communication with the neighboring and distant modules is bidirectional, as illustrated in FIG. 10 where the communications F1, F2 and F21' are all bidirectional, with the implementation of data routings in the intermediate modules M1.

It may be of course considered to take into account communications F3, ... FN between the module M0 and the neighboring modules of rank 3, ..., N; these communications F3, ... FN transiting by routing in the intermediate modules M1, M2, ..., M (N−1).

The rest of the description concerns the operation of the communication between the modules during the second phase for executing the driving algorithm.

Ideally, the second execution phase is based on a periodic synchronous operation of the modules of the installation and the distributed algorithms. At each cycle, a fixed amount of information is exchanged between neighboring modules, then each module executes a cycle of its program or driving algorithm. In order to approach this synchronous ideal, the execution phase is based on a pseudo-synchrone operation, with the implementation of either of the two following communication modes:

- a first communication mode based on a single timing source (the master module) and without jitter control, this first method being to promote for the start of the installation as well as for the identification of defective modules; and
- a second mode based on a variable number of timing sources with jitter control, this second mode being to promote for an optimized operation after starting the installation.

In both modes, during the implementation phase, the controller of the master module transmits a synchronization signal which is propagated to other modules, so that the modules exchange between each other data frames (or packets) distributed in successive periodic cycles (of period P), where each frame is divided into a plurality of time slots including a time slot reserved for a synchronization signal and the next time slots reserved for local variables described hereinabove, and useful for executing the driving algorithm.

The first communication mode is based on a locally synchronous operation and without jitter control, in which the unique timing source is given by a synchronization signal at the beginning of each cycle sent from the controller of the master module. The description of this first communication mode is carried out with reference to FIGS. 11a to 11d and 12a to 12c.

Referring to FIG. 11a, only one module (in this case the master module MM) creates the timing by distributing, on the communication outputs of its connectors, a synchronization signal at the beginning of the cycle with a period P. This distribution is illustrated in FIG. 12a by the arrows which start from the module MM toward its neighboring modules.

Referring to FIGS. 11b 11d, this synchronization signal is propagated by the connectors of the modules. The master module then gives the timing or the period by means of this synchronization signal.

Figure 12A:
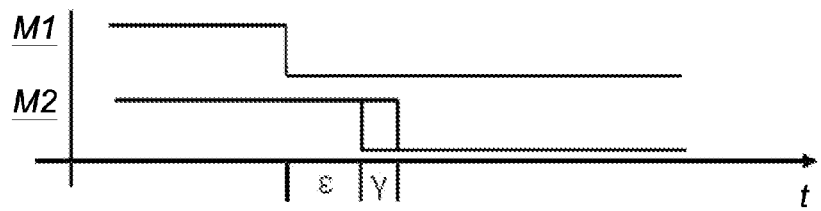
FIGS. 12a to 12c are schematic views of the communicated data between modules in a communication mode based on a single timing source and without jitter control.

Referring to FIG. 12a, the synchronization signal is propagated by the connectors of the modules, and this propagation marks the beginning of the cycle for each module. A module M1 which receives the synchronization signal on one of its inputs (signal S1) propagates it to the neighboring modules M2 on its communication outputs receiving it (signal S2) within a delay comprised between $\epsilon$ and $\epsilon+\gamma$ with:

- $\epsilon$ the minimum propagation time between the controller of a module M1 and the controller of the next neighboring module M2; and
- $\gamma$ the jitter of the cycle;

The result of this time shift is that each pair of neighboring modules directly linked by their respective connectors, are linked by a time shift of the cycle bounded by $\epsilon+\gamma$.

Figure 12B:
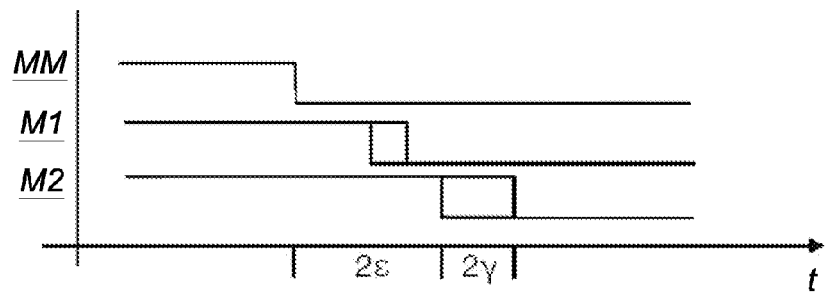

Referring to FIG. 12b, the jig of the cycle for each module with a rank n of the master module MM, may vary with $n\gamma$. A module of rank 2 relative to the master module MM is in time shift comprised between $2\epsilon$ and $(2\epsilon+2\gamma)$, and a module of rank n relative to the master module MM is in time shift comprised between $n\epsilon$ and $(n\epsilon+n\gamma)$. It is therefore necessary to ensure that the time expected for the communication plus the cumulative jitter $n\gamma$ does not exceed the period P of the communication cycles.

Figure 12C:
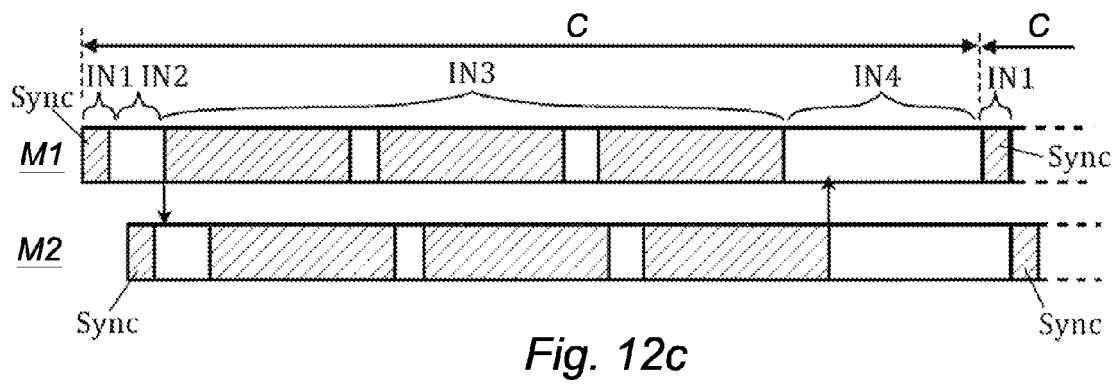

Referring to FIG. 12c, in response to this problem, it is expected that during period P (that is to say during each cycle C), the controller of each non-master slave module at a rank n relative to the master module MM, distributes a data packet PD being subdivided into several time slots allocated in the following manner:

- a first time slot IN1 allocated to the synchronization signal Sync;
- a second time slot IN2 called data empty waiting time slot, said second time slot having a duration T2 where $T2 \geq \epsilon+\gamma$;
- a third time slot IN3 allocated to the output variables (which will, for the record, the input variables of the neighboring module which receives this packet); and
- a fourth time slot IN4 called dead time slot, said fourth time slot has a duration T4, where $T4+\epsilon+n\gamma$, with n the rank of the module relative to the master module MM in the communication chain.

Thus, the neighboring modules M1, M2 communicate with each other by transmitting, at each cycle C, data packets PD divided as described hereinabove, with of course the time shift present in this communication.

The second time slot IN2 called waiting time slot guarantees that a delayed neighboring module M2 will be ready to receive data when they are sent.

The fourth time slot IN4 called dead time slot, located at the end of the cycle C, allows ending the reception in the neighboring module in advance and waiting for the next synchronization signal while compensating the cumulative jitter $n\gamma$. It will be thus noted that the cumulative jitter $n\gamma$ may limit the useful part for the communication of each cycle C, so that this first communication mode requires an estimate of the maximum jitter in the installation.

The second communication mode is based on a locally synchronous operation with jitter control, which is adapted to limit the local jitter, and thus to increase the useful part of the data packets at each communication cycle, by bounding the jitter in each module.

With this second communication mode, the controller of each slave module performs the following steps:

- If elapsed, upon the receipt of the synchronization cycle of the data packet of the previous cycle coming from a neighboring module called previous neighboring module, a time slot called said delay time slot Tdelay, then said controller transmits a data packet with a synchronization signal to the other neighboring modules called next neighboring modules without waiting for the synchronization signal of the data packet of the next cycle which will come from said previous neighboring module, where:

Tdelay=$P+\epsilon+\gamma$, with

P the duration of the cycle of the master module;
$\epsilon$ the minimum propagation time between the controller of a module and the controller of the next neighboring module; and Y the jitter of the cycle;
if, upon the receipt of the synchronization signal of a data packet of the current cycle coming from a previous neighboring module, there is, since the reception of the synchronization signal of the previous cycle from said previous neighboring module, a time slot called advance time slot Tadvance, then the controller waits for a time slot Tshift before transmitting on its outputs the data packet to the next neighboring modules, where:

Tadvance≤$P+\delta$, with $\delta$ the offset time between the cycle of the module and the cycle of the previous neighboring module, where $\delta \le \epsilon+\gamma$.

In other words, if the synchronization signal of the next cycle arrives late, that is to say after that the delay interval Tdelay has elapsed after receiving the previous synchronization signal, then the module will start the cycle without waiting for the synchronization signal. Consequently, this module will create the synchronization signal to its neighboring modules (it is then about a communication with a variable number of timing sources).

Conversely, if the synchronization signal of the next cycle arrives too early, the module will wait the time slot Tshift before relieving, with Tshift=$P+\epsilon-\gamma$.

Thus, for each module, the jitter for the duration of cycles and for generating the synchronization signal is limited to $\gamma$, and the shift in the communication with the neighbors is limited to ($\epsilon+\gamma$). Thus, it can be seen that the system stabilizes towards the cycle beginning which corresponds to the distance (or rank n) vis-à-vis the time source (the master module) multiplied by ($\epsilon+\gamma/2$).

The rest of the description concerns the latency in the installation during the execution phase, inherent to the synchronous programming, and on the limiting of this latency by implementing a data routing protocol.

As described hereinabove, the synchronous programming involves, for each module controller, the close integration of the execution of the two following phases:
communication phase which allows propagating and communicating values of the variables of a module to its neighboring modules;
calculation phase for the implementation of a driving program of the module, comprising the processing of different variables (input variables, measurement data, state variables) and the modification of the variables specific to the module.

In this principle, the variables communicated in the current cycle by the neighboring modules represent values written by these same modules during the previous cycle, so that the reading latency of the variables between neighboring modules is one cycle (or one period).

This latency has the global consequence of a kind of information flow velocity in the installation which would be a jump per cycle. However, this latency may be avoided when using the following routing protocol.

With this data routing protocol, during each cycle, the data packets exchanged between two neighboring modules are cut and sent in several groups distributed over time slots longer than a time shift of the propagation between two neighboring modules of rank n and n+1 respectively, so that each byte of a group of order NO is received on a connector before sending the corresponding byte of a group of higher order NO+1 of another connector Indeed, during each cycle, according to the communication velocity and the cycle duration, a certain amount of information may pass from one module to the neighboring module. This communication between two modules is synchronous on all connectors, except for the shift and the jitter.

By cutting the data set sent in several groups (of several bytes) of a sufficient size to ensure that the sending of a group exceeds the shift between neighboring modules, it is ensured that each byte of a group of a lower order number NO is received on a connector before sending the corresponding byte of a group of higher order than NO+1 on another connector.

Figure 14:
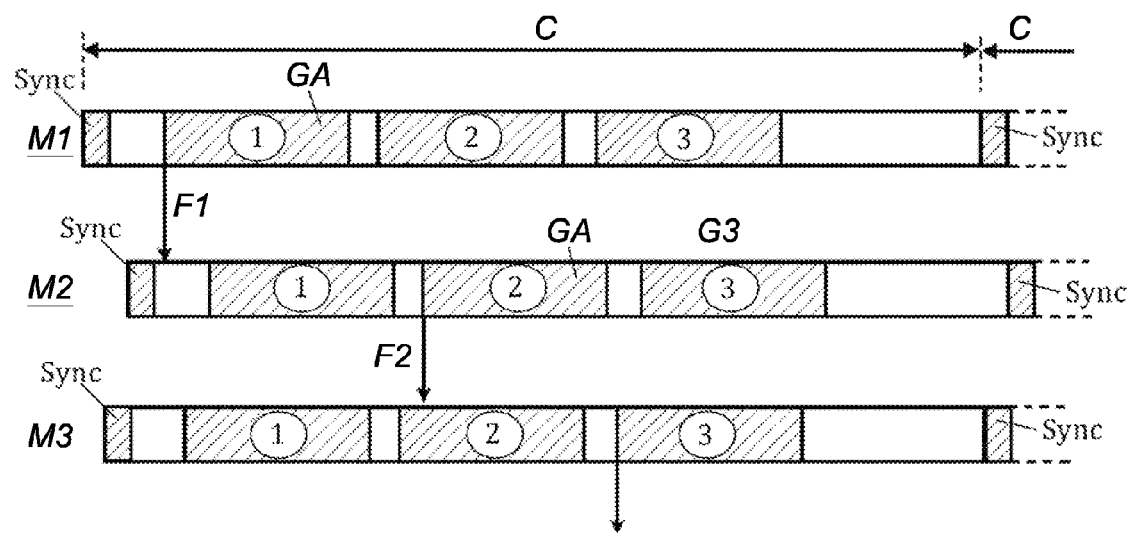
FIG. 14 is a schematic view of the implementation of a routing protocol.

FIG. 14 schematically illustrates this routing protocol, which shows:
sending (arrow F1) a data group GA of order number 1 from the module M1 to the module M2, then
the same group GA is sent (arrow F2) from the module M2 to the module M3 as a group of numbers of rank 2, and so on.

It is of course possible to route in the opposite direction, a group of higher order NO to a group of lower order NO−1, but this, in two successive cycles and not in the same cycle. It is also advantageous to provide a routing table to automate routed flows.

This routing protocol allows significantly reducing the latency in the network, up to a factor M in the case of Z byte groups where, in a cycle, the data pass through until Z modules.

The integration of this routing protocol with the synchronous programming described hereinabove will comprise for example of a classification of two classes of groups, those for which the communication is carried out between two executions of the driving program (and then with latency inherent to a cycle) and those which are communicated during the execution of the driving program (in a double buffer and therefore with a latency of two cycles).

However, it is noteworthy that these latencies of one or two cycles are not accumulated for the number of jumps, from module to module. By way of example, if a group of bytes performs five jumps in a cycle, then its latency for a distance of four jumps would be one or two cycles (according to the two aforementioned types of groups), and its latency over a distance of seven jumps would be two or three cycles. This latency may be accurately calculated for each module and each case.

Although complicating the programming, this routing protocol advantageously allows a module to use, at each cycle, variables not only of direct neighbors, but also of neighbors located at ranks greater than or equal to two.

The invention claimed is:
1. A programmable module for a modular installation of signal transmitters, said module comprising:
a support base delimited by edges;
at least one signal transmitter fastened on said base;
at least one controller fastened on said base and linked to said at least one signal transmitter for driving the transmission of signals;
at least two connectors fastened on the edges of said base and linked to said controller, each connector having:
an electrical power supply interface for said at least one signal transmitter and said at least one controller; and a bidirectional communication interface connected to said at least one controller and having a communication input and a communications output;

where at least one of said connectors is connected with a connector of a neighboring module in the modular installation for allowing a bidirectional communication between the controller of said module and the controller of said neighboring module and a distribution of the electrical power supply between the modules.

2. The module according to claim 1, wherein at least one signal transmitter is a light signal transmitter, in particular of the light-emitting diode type.

3. The module according to claim 1, further comprising at least one sensor for measuring a local parameter fastened on the base, in particular of the proximity sensor type, said at least one sensor generating local measuring data and the controller being linked to said at least one sensor to receive said local measurement data.

4. The module according to claim 1, wherein the module includes a connector on each edge.

5. A modular installation of the type comprising several modules in accordance with claim 1, wherein each module has at least one connector connected to a connector of a neighboring module.

6. The modular installation according to claim 5, wherein the base of each module has at least one edge on which a connector is fastened, where said edge is contiguous to an edge of the base of an neighboring module on which a connector is also fastened, and the two connectors fastened on said contiguous edges are interconnected.

7. The modular installation according to claim 5, wherein the bases of the modules are distributed in a planar or volume tiling, the base of each module being disposed contiguously to the base of at least one neighboring module, and each module being connected to its neighboring module(s) through their respective connectors.

8. The modular installation according to claim 5, further comprising a single source of a driving program of the controllers of the modules, said source being provided to be connected to a controller of a module called master module.

9. A method for synchronous driving of a modular installation in accordance to claim 5, wherein each module executes the same program in a periodic cyclic and synchronous manner, in which, at each cycle, each module establishes a bidirectional communication with the neighboring module(s) and executes one or more algorithms of said program.

10. The method according to claim 9, wherein a module called master module constitute a unique source of the periodic timing for the execution of the same program by the modules, where said master module generates a synchrinization signal which is propagated step by step between the modules starting from the master module via their respective connectors.

11. The method according to claim 9, wherein the execution of the same program by the modules is preceded by a phase for inputting a driving algorithm to the controller of at least one module called master module, in the form of data frames distributed in successive periodic cycles, the other modules being called slave modules, and in which the execution of the same program by the modules includes the following phases:

a first phase for executing a distribution algorithm in which the data frames of the driving algorithm are synchronously and periodically distributed, step by step between the modules starting from at least one module called master module;

once the distributed driving algorithm is completely loaded in all controllers, a second phase for synchronously and periodically executing the driving algorithm by each controller.

12. The method according to claim 11, wherein the first distribution phase is preceded by a phase for determining a maximum distance corresponding to the greatest distance between the at least one master module and the most distant slave module(s) in the installation by routing from neighboring module to neighboring module according to the shortest path(s), to establish the time required for the distribution phase so that the distributed driving algorithm is completely loaded in all controllers.

13. The method according to claim 11, wherein the phase for inputting the driving algorithm and the first phase for executing the distribution algorithm are performed:

either sequentially, where said first phase begins once the driving algorithm is completely loaded in the controller of the at least one master module;

or in parallel, where each controller of a module receives in a current cycle, a data frame of the driving algorithm and propagates them to the controller(s) of the neighboring module(s) in the next cycle.

14. The method according to claim 11, wherein, during the first phase for executing the distribution algorithm, at each cycle, the controller of each module performs the following operations:

receiving a synchronization signal on at least one communication input, and transmitting the synchronization signal on the communication outputs;

listening on all communication inputs of the module;

receiving a data frame of the driving algorithm on at least one communication input of the module, said data frame corresponding to a data frame transmitted during the previous cycle by a neighboring module on the communication output connected to said communication input of the module;

storing said data frame in said controller;

transmitting said data frame on the communication outputs to the neighboring modules.

15. The method according to claim 11, wherein, during the second phase for executing the driving algorithm, at each cycle, the controller of each module performs the following operations:

receiving a synchronization signal on at least one communication input, and transmitting the synchronization signal on the communication outputs;

listening on all communication inputs of the module;

reading the measurement data coming from the at least one sensor;

reading variables called state variables representative of the state of the module in particular the state of the at least one signal transmitter;

reading a data packet called incoming data packet on at least one communication input of the module, said data packet integrating at least one input variable for executing of the driving algorithm;

executing the driving algorithm with, as an input, the input variable(s) of the data packet(s) received in the current cycle, the measurement data and the state variables, and, as an output, driving instructions of the signal transmitter(s) of the module, updating the state variables, and calculating output variables associated with each communications output;

transmitting on each communication output a data packet called said outgoing data packet integrating the output variables associated with each communication output.

16. The method according to claim 15, wherein, during the second phase for executing the driving algorithm, at each cycle, the incoming data packet or each incoming data packet in a current cycle corresponds to an outgoing data packet transmitted during the previous cycle by a neighboring module on the communication output connected to said communication input of the module, and the outgoing data packet or each outgoing data packet transmitted in a current cycle is received by the concerned neighboring module in the next cycle.

17. The method according to claim 15, wherein the second phase for executing the driving algorithm comprises, preferably at the beginning of the second phase, a communication phase with a unique timing source without jitter control, the unique timing source given by the synchronization signal at the beginning of each cycle sent by the controller of at least one master module.

18. The method according to claim 15, wherein the second phase for executing the driving algorithm comprises, preferably after the starting of the installation, a communication phase with a variable number of timing sources and with jitter control, in which a controller of at least one slave module generates its own synchronization signal that is transmitted to the neighboring modules on its communication outputs.

19. The method according to any one of claim 11, wherein the second phase for executing the driving algorithm implements a data routing protocol, in which during each cycle the data packets exchanged between two neighboring modules are cut and sent in several groups distributed over time slots longer than an offset time of the propagation between two neighboring modules of rank n and n+1 respectively, so that each byte of a group of order NO is received on a connector before sending the corresponding byte of a group of a higher order NO+1 on another connector.

* * * * *